United States Patent [15] 3,636,617
Schmidt et al. [45] Jan. 25, 1972

[54] METHOD FOR FABRICATING MONOLITHIC LIGHT-EMITTING SEMICONDUCTOR DIODES AND ARRAYS THEREOF

[72] Inventors: John George Schmidt, St. Louis, Mo.; Enghua Lim, Los Gatos, Calif.

[73] Assignee: Monsanto Company, St. Louis, Mo.

[22] Filed: Mar. 23, 1970

[21] Appl. No.: 21,639

[52] U.S. Cl. ..................................29/578, 29/589, 148/185, 148/187, 317/234

[51] Int. Cl. ..........................................B01j 17/00, H01l 5/00

[58] Field of Search ........................29/569 L, 578, 589, 590; 148/185; 317/234 L, 234 M

[56] References Cited

UNITED STATES PATENTS 3,312,577 4/1967 Dunster et al. ....................29/578 UX
3,368,274 2/1968 Brunet....................................29/589
3,489,622 1/1970 Barson et al. .........................29/578 X
3,411,199 11/1968 Heiman et al........................29/578 X

*Primary Examiner*—John F. Campbell
*Assistant Examiner*—W. Tupman
*Attorney*—William I. Andress, John D. Upham and Neal E. Willis

[57] ABSTRACT

The disclosure herein relates to a method for fabricating planar, monolithic light emitting diodes and arrays thereof from an N-type intermetallic semiconducting material. Controlled regions of P-type conductivity are formed in the N-type material to form a PN-junction by means of controlled zinc diffusion through a multilayer diffusion-masking system comprising coherent films of silica and phosphorus-doped silica. Metallized ohmic contacts are formed on the top (front) surface and ohmic contact to the backside of the zinc diffused semiconductor material is made by a contact system comprising an alloyed multilayered structure of coherent films of tin, gold, nickel, and gold. Electrical leads and a lens are attached to the fabricated diodes to provided either discrete diodes or monolithic arrays thereof.

4 Claims, 16 Drawing Figures

INVENTORS
ENGHUA LIM
JOHN G. SCHMIDT

BY William J. Andress

ATTORNEY

INVENTORS
ENGHUA LIM
JOHN G. SCHMIDT
BY William J. Andress
ATTORNEY

METHOD FOR FABRICATING MONOLITHIC LIGHT-EMITTING SEMICONDUCTOR DIODES AND ARRAYS THEREOF

BACKGROUND OF THE INVENTION

This invention relates to field of solid-state light-emitting devices and fabrication methods therefor.

Current and prior art methods for generating light include incandescent lamps, electric discharge in gases, phosphorescent bodies and solid-state semiconductor devices.

Numerous solid-state light emitters are described in the literature and these are prepared in a variety of ways. One method described in the literature for fabricating electroluminescent diodes involves the diffusion of impurities of one conductivity type into a selected region of a semiconductor substrate of different conductivity to form a PN-junction. The diffusion may be accomplished by face-to-face contact of the diffusant material with the semiconductor substrate, or by vapor diffusion of impurities into the substrate crystal through masks if desired. PN-junction devices are also prepared by epitaxial deposition of films of one conductivity type onto a substrate of another conductivity type. Electrical contacts are attached to the PN-junction semiconductor device which is then packaged and ready for use.

Solid-state light-emitting devices disclosed in the literature are fabricated and used either as discrete devices or hybrid arrays thereof manually bonded to a substrate with a common anode. It has also been sketchily reported in the literature that monolithic arrays of light-emitting semiconductor diodes, such as gallium arsenide, gallium phosphide and gallium arsenide phosphide, have been prepared, but few details thereof have been disclosed.

Various disadvantages and limitations apparent in the methods of fabrication of solid-state light-emitting diodes and the diodes themselves include the difficulty and imprecision of various methods of forming PN-junctions of the depth and shape most suitable for fabricating light-emitting diodes (LED's). Current diffusion processes disclose numerous problems including diffusion-masking materials which do not adhere to the substrate and/or which do not permit obtaining controllable diffusion profiles and/or which are formed by means of complex operations and expensive equipment. Another problem arises from difficulties in forming good ohmic contact to the semiconductor crystal. Still other problems and limitations in prior art solid-state devices relate to low brightness and efficiency, high power requirements, short lifetime, vulnerability to vibration, obstructing emitting surfaces, narrow viewing angles, complex electrical circuitry, incompatibility with integrated circuits or relatively large minimum size limitations. Currently, the only practical numeric and alphanumeric light emitting displays are made up of a plurality of discrete LED's.

Accordingly, it is an object of this invention to provide monolithic, planar, solid-state light-emitting diodes and arrays thereof which are compatible with integrated circuits; have low power requirements; are mechanically and electrically stable; have long operating lifetimes; have relatively high efficiency and brightness; have a high stacking density and single-plane viewing with wide viewing angle when used in numeric and alphanumeric displays.

It is a further object of this invention to provide a fabrication technique for providing the monolithic light-emitting diodes and arrays thereof according to this invention.

These and other objects of the invention will become apparent as the description proceeds.

SUMMARY OF THE INVENTION

This invention relates to a unique combination of fabrication techniques to provide planar, monolithic, solid-state light-emitting diodes (LED's) and arrays thereof.

The fabrication process includes the use of a controlled diffusion of a P-type dopant, preferably zinc, into an N-type intermetallic semiconductor, preferably gallium arsenide phosphide. The diffusion process utilizes a combination of thin films of silica and phosphorus-doped silica to provide a means of diffusing P-type dopants into selected areas (of any geometrical configuration) of an N-type semiconductor body. Successive salient features of the process include the use of a new ohmic contact system for N-type semiconductors comprising applying successive layers of tin, gold, nickel and gold to the semiconductor and alloying the metals in the layers with the semiconductor body. The ohmic contact operation is followed by attaching the semiconductor body to a gold-plated Kovar base or a gold/palladium screen printed and fired base such as alumina. Electrical leads are then attached to the device which is then packaged and ready for use as discrete diodes or arrays thereof.

DESCRIPTION OF PREFERRED EMBODIMENTS

The present invention in its preferred embodiments relates to a method for fabricating planar light-emitting semiconductor devices, either as discrete LED's or as an array of LED's on a monolithic semiconductor wafer or crystal. The monolithic light-emitting devices prepared according to the present invention have many advantages not found in light-emitting devices currently available commercially, including low power requirements, high brightness, reliability, long lifetime, compatibility with integrated circuits, low cost, high stacking density and wide angle viewing. More broadly, the fabrication process provided according to this invention is suitable for producing PN-junction devices generally.

EXAMPLE 1

In a preferred embodiment of this invention, LED's are prepared with gallium arsenide phosphide, $GaAs_{1-x}P_x$, where $x$ is a number from zero to one inclusive, as the semiconductor component of the device.

Figures 1, 1A, 1B, 1C, 1D, 1E, 1F, 1G, 1H, 1I, 1J, 1K, 1L, 1M:
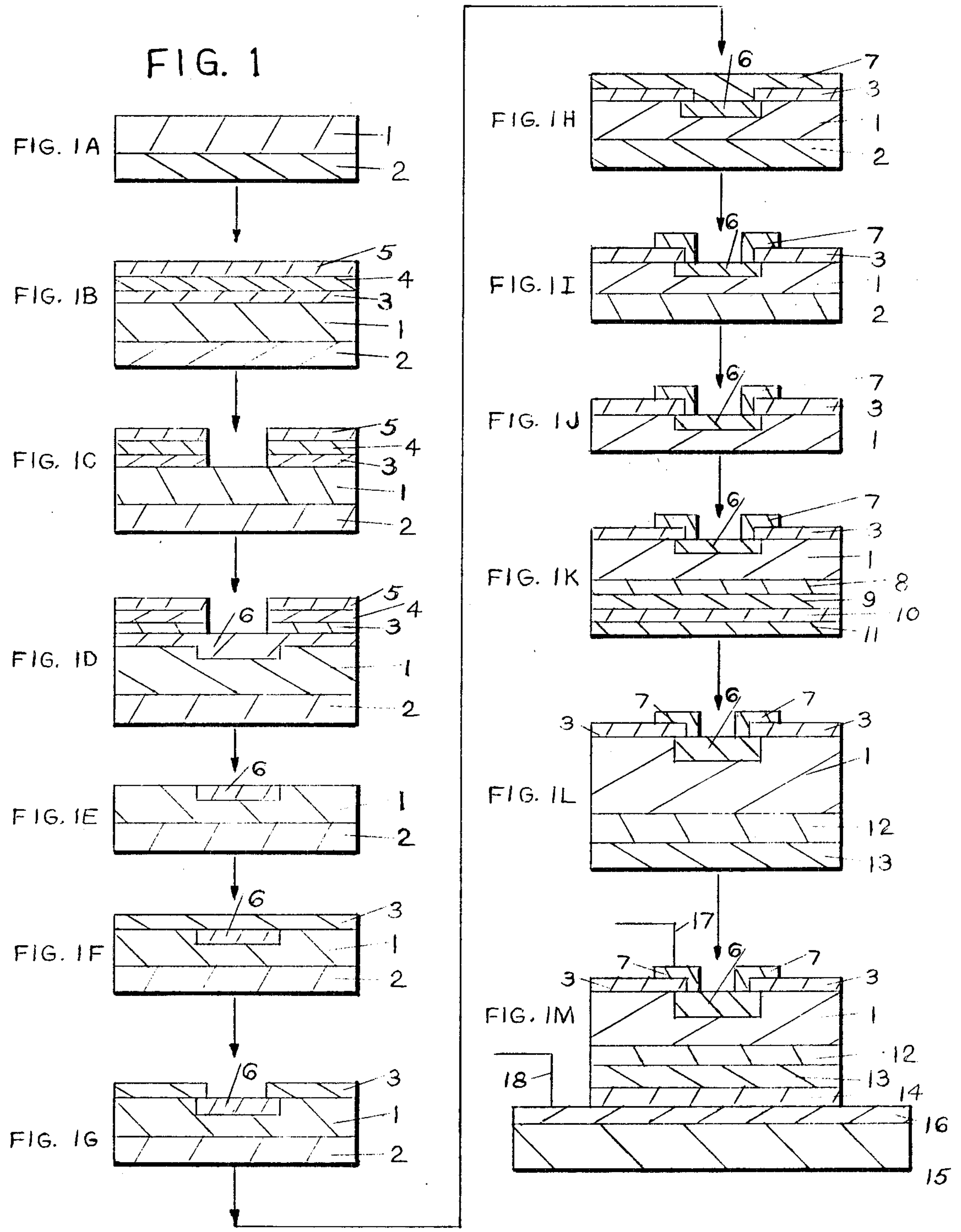
FIG. 1 is a flow diagram showing cross-sectional views of semiconductor LED's at various stages of preparation.
FIG. 1A is a view of one N-type semiconductor deposited epitaxially on another N-type substrate preparatory to the LED fabrication according to this invention.
FIGS. 1B and 1C show schematic views of the semiconductor body with the multilayered diffusion mask in place and the "window" subsequently opened therein by conventional photoresist methods to expose the surface of the semiconductor to P-type impurity doping by diffusion.
In FIG. 1D is shown an exaggerated profile of the P-type region and the PN-junction formed after diffusion through the diffusion mask.
In FIG. 1E the diffusion mask has been removed and the semiconductor crystal surface prepared for the next operation.
In FIGS. 1F and 1G are shown a layer of silica deposited on the surface of the crystal and a window opened in the silical layer by photoresist means preparatory to metallization to form the P-surface contact.
FIGS. 1H and 1I show a layer of metal deposited on entire surface of the crystal and the resulting metal contact with the P-region after windows are opened in the metal layer by photoresist methods.
In FIG. 1J the original N-type substrate has been removed preparatory to formation of the backside ohmic contact.
FIG. 1K shows the multilayered structure used herein prior to forming the backside ohmic contact.
In FIG. 1L is shown the structure of the device after alloying the plural layers of contact materials, shown in the preceding figure, with the semiconductor crystal.
FIG. 1M shows a cross-sectional view of one device embodiment prepared in accordance with the invention wherein light generated in the crystal is emitted through a crystal-ambient interface.

Referring to FIG. 1 which is a flow diagram showing cross-sectional views of the device at various stages of the fabrication process, 1 is an epitaxial layer of GaAsP deposited on a substrate of gallium arsenide, GaAs, 2 with a (100) orientation and a wafer flat located on a (110) plane. The GaAsP layer is grown to a thickness of about 200 microns and is characterized as having a phosphorus content within the range of 30 to 50 percent, a carrier concentration of from $1.0\times10^{16}$ to $1.0\times10^{18}$ carriers/cc. of tellurium, a mobility in excess of 1,300 $cm.^2$/volt-sec., a typical resistivity of 0.028 ohm-cm. and a dislocation density of less than 2,000/$cm.^2$. The GaAs is of N-type conductivity, doped with tellurium and having a resistivity within the range of 0.001–0.005 ohm-cm.

The surface of the GaAsP is lapped, polished and etched to provide a damage-free, flat and uniform surface. Thereafter, as shown in FIG. 1B, a layer 3 of $SiO_2$ is deposited 200 A. thick by the vapor phase oxidation of silane at a wafer temperature of 325° C. A second layer 4 of silica containing 5 percent phosphorus pentoxide is deposited to a thickness of 1,500 A. by the simultaneous vapor phase oxidation of silane and phosphine. The phosphorus content in this layer may vary from about 1 to 40 percent. Finally, an additional layer 5 of pure silica is deposited on the phosphorus-doped silica layer 4 to a thickness of 200 A. The surface of the wafer is then coated with a commercially available photoresist (not shown) and by conventional photoresist techniques, the photoresist exposed to ultraviolet light (U.V.) through a pattern, developed with a suitable solvent such as xylene and then baked. A buffered solution of HF is used to etch windows in the silica layers 3, 4, and 5 as shown in FIG. 1C to expose the surface of the GaAsP crystal 1 in any desired configuration for subsequent conversion to P-type conductivity by diffusion with P-type impurities, e.g., zinc in the present embodiment. The photoresist is then removed by commercially available solvents and the exposed surface of the GaAsP etched and suitably cleaned.

The GaAsP surface is then diffused with zinc arsenide at 800° C. for 50 minutes to form a P-region 6 which is 6 microns deep. The three layers of oxides 3, 4, and 5 are then removed from the surface of the GaAsP by etching and about 3 to 4 microns of the GaAsP surface itself is also removed by etching, then cleaned. Thereafter a fresh coat of $SiO_2$ 3 in FIG. 1F is deposited on the cleaned surface of the wafer and coated with photoresist which is exposed to U.V. light through a pattern to define an area for the P-surface contact on the wafer. The photoresist is developed, baked and etched as before to open windows in the $SiO_2$ to define the selected area for the P-contact. Metallic aluminum is then evaporated onto the surface of the wafer forming a layer 7 in contact with the P-region 6 of the wafer as shown in FIG. 1H. The aluminum layer is then coated with photoresist, exposed to U.V. light, through a pattern of the desired configuration, developed and baked. The aluminum layer is then etched with a suitable solvent, e.g., aqueous NaOH mixture, to open windows in the layer and form the aluminum contacts with the P-region of the wafer as shown in FIG. 1I.

Following the preparation of the semiconductor wafer P-region contact, the GaAs substrate wafer 2 in FIG. 1I is removed by lapping and at this time a small amount of GaAsP is also removed to reduce it to a thickness of from 0.006 to 0.008 inch in order to reduce electrical resistance across the LED to be formed. The wafer is then cleaned after the lapping operation with any suitable cleaning agent, e.g., an aqueous isopropyl alcohol solution. The wafer as shown in FIG. 1J is now ready for formation of the backside ohmic contact.

In FIG. 1K is shown a preferred sequence of layering the backside ohmic contact materials. In sequence, a layer 8 of tin is first evaporated onto the backside of crystal 1, then a layer 9 of gold is evaporated onto the tin layer. Next, a layer 10 of nickel is plated onto the first gold layer and a second layer 11 of gold evaporated onto the nickel layer to protect it against oxidation. This multilayered contact structure is then heated to 430° C. for about 30 minutes or, in general, to a temperature sufficiently high to alloy the metals in the layers with the components of the N-type region 1 of the semiconductor and form a region 12 of $N^+$ conductivity and a metallic layer 13 high in nickel content as shown in FIG. 1L.

A modification of the preceding embodiment is to alloy the tin layer 8 and first gold layer 9 (FIG. 1K) with the N-type crystal at about 430° C. in a nitrogen atmosphere to create the $N^+$ region 12 shown in FIG. 1L, and then plate with the nickel and evaporated gold layers, 10 and 11, respectively, and again heat to alloy the nickel and gold with the components of the $N^+$ layer 12 and form the nickel-rich layer 13 shown in FIG. 1L.

After the alloying operation described above, the semiconductor crystal, upon which may be formed many discrete diodes or arrays of diodes, is scribed and broken into individual units ("die" or "dice"). In FIG. 1M, these dice are then mounted with a gold/epoxy preform 14 on a Kovar base 15 plated with a layer of gold 16 and heated to bond the die to the base. Gold leads, or other suitable lead material, 17 and 18 in FIG. 1M are attached as shown. The device is then packaged, suitably with an epoxy lens (not shown).

In other embodiments of LED devices fabricated according to the invention, the base 15 may be various conductors, insulators or semi-insulators plated with or screen printed and fired with various metals or alloys. One preferred embodiment makes use of an alumina base screen printed with a gold/palladium alloy and fired. Other suitable plating or screen printed materials for the base include various metals and alloys such as molybdenum and/or manganese, molybdenum/gold, etc. Other preforms such as alloys of various metals, e.g., gold/silicon, tin/lead, gold/germanium alloy, can suitably be used herein. Any plating or screen print material and preform material capable of forming good mechanical and electrical connection with the semiconductor component and the base or header may be used.

EXAMPLE 2

Figure 2:
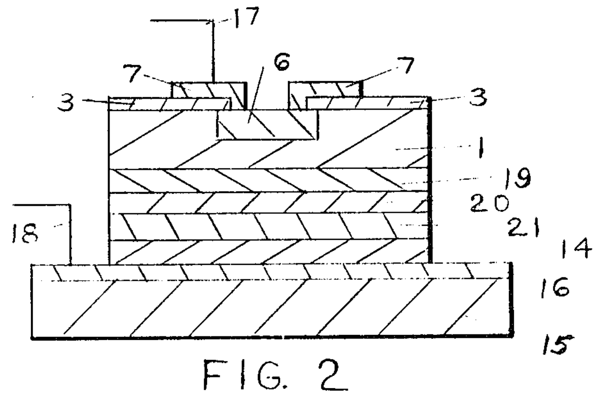
In FIG. 2 is shown an alternative device embodiment wherein the original N-type substrate material is retained throughout the fabrication process.

A further embodiment of LED devices fabricated according to this invention is shown in FIG. 2. An epitaxial film of GaAsP 1 is epitaxially deposited on a substrate of N-type GaAs (comprising the N and $N^+$ layers 19 and 20, respectively) as in Example 1. In this embodiment, the GaAs substrate is not removed (but it may be reduced in thickness if desired) by lapping, but is retained as an integral part of the LED device fabricated. The backside ohmic contacting procedure described above is applied to the GaAs surface, thereby forming an $N^+$ region 20 and a nickel-rich region 21 therein. The device is then bonded to a suitable base 15, such as gold-plated Kovar, by means of a gold/epoxy preform 14. Electrical leads 17 and 18 of gold wire are attached and the device is packaged as described above for use.

The procedure in this example may be modified by using a gold/palladium screen printed and fired alumina base bonded to the semiconductor component by means of a gold/germanium alloy.

EXAMPLE 3

In the embodiment described in this example a device is prepared having a silica lens over the light-emitting P-region of the LED.

Figure 3:
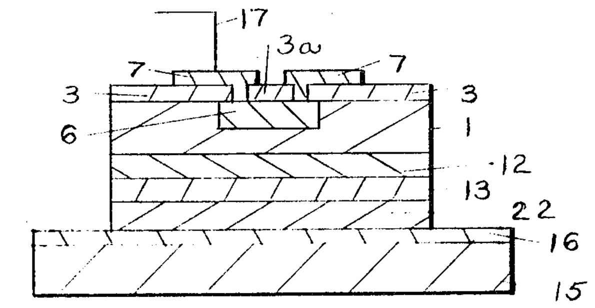
In FIG. 3 is shown another device prepared by the process herein wherein light generated in the crystal is emitted to the ambient atmosphere through a silica lens.

The procedure described in example 1 above is repeated for diffusing a P-region into the surface of a wafer of GaAsP with zinc arsenide as the diffusant. The silicon oxides diffusion mask is removed by etching, after which the surface of the wafer is etched to define the PN-junction and to increase brightness. A new mask of $SiO_2$ is laid down as before in FIG. 1F. In this embodiment, however, having reference to FIG. 3, two windows (in cross-sectional view) rather than one are opened through the $SiO_2$ mask 3 to the P-surface of the wafer 1 by the photoresist method. It is understood, of course, that a top plan view of this wafer would show a circular etching ring around an island of $SiO_2$. In general, only the area (of any shape) that is required for ohmic contact is etched through the $SiO_2$ mask. Aluminum metal is evaporated over the surface of the wafer to form layer 7 which is in contact with the GaAsP. Using the photoresist technique, a mask is used to define the aluminum contact in the desired configuration. By etching portions of the aluminum layer are removed leaving metal contacts in areas corresponding to the desired configuration shown in FIG. 3. In this manner an $SiO_2$ lens 3*a* is formed over the light-emitting P-region between the aluminum P surface contact. The backside ohmic contact comprising successive layers of tin, gold, nickel and gold is alloyed to the wafer 1 to form an $N^+$ region 12 and a nickel-rich region 13. By use of a gold/epoxy bonding agent 22, the semiconductor unit is bonded to a gold-plated Kovar header; lead 17 is attached and the LED is packaged and ready for use.

EXAMPLE 4

Figure 4:
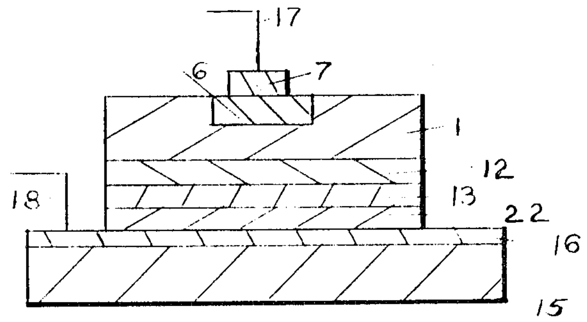
FIG. 4 is a cross-sectional view of still another device prepared according to this invention where a metal contact is situated in a central section of the P-region of the crystal.

A further embodiment of LED devices fabricated according to the invention is shown in FIG. 4. In the embodiment of this example, using the same symbols as in the preceding example, the backside ohmic contact procedures used in examples 1 and 3 are followed, but the procedure and resulting device is otherwise altered by applying the metallized P-surface contact directly to the P-surface of crystal. Again, the desired metal contact configuration is effected by photoresist techniques. In this example, aluminum contact 7 of any configuration is attached to a center portion of the P-region 6. Electrical leads, 17 and 18, of gold wire, or any other suitable material, are bonded to the device, after which the device is packaged, e.g., in clear epoxy resin, and ready for use.

A further modification of the embodiment in FIG. 4 is to leave the GaAs substrate in the device and proceed as described in example 2 to obtain a device having a backside structure similar to that shown in FIG. 2.

The fabrication technique described herein is equally applicable to the formation of monolithic arrays of light-emitting diodes as well as discrete diodes. Discrete diodes prepared according to this invention may be grouped together in various combinations to form numeric and alpha-numeric displays. MOre desirably, many discrete light-emitting areas are formed monolithically on a single semiconductor chip, effecting great advantages, e.g., in packing density, less complex circuitry, etc.

The fabrication techniques described herein are applicable to a great many semiconductor elements and compounds such as silicon, germanium and mixtures thereof, the nitrides, phosphides and antimonides of boron, aluminum, gallium, indium and mixtures thereof, and the sulfides, selenides and tellurides of zinc, cadmium and mercury. Diffusion conditions and ohmic contacting procedures will vary from one material to another. It will also be appreciated that other diffusion barriers and metallization systems than specifically mentioned herein may be substituted therefor without departing from spirit and scope of the fabrication process set forth. It is also understood that LED devices are not the only semiconductor devices to which the fabrication process is applicable.

While the invention has been particularly shown and described with reference to preferred embodiments thereof, it will be understood by those skilled in the art that the foregoing is merely exemplary and not exhaustive of the invention and that still other modifications of the invention will occur to those skilled in the art. For example, while the description makes particular reference to forming the ohmic contact of this invention on the backside of the crystal, it will be appreciated that the contact may equally well be formed on the top or front surface where desirable, as in operations requiring the P-surface of the crystal to be in the backside position or where ohmic contact is required on an N-type top surface region of a crystal as in transistors. Also, it will be appreciated that the various components of the ohmic contaCt system may be applied in layers of varying thickness and heated at various times, temperatures and pressures in order to produce the ohmic contact according to this invention. MOreover, it is further understood that the method(s) by which the various layers are applied is not critical, and that the various layers may be applied by techniques selected from those known to one skilled in the art, such as by controlled evaporation, spraying, sputtering, painting, electrolytic plating, etc., and/or selected combinations of these and other techniques.

We claim:

1. A process for fabricating solid-state semiconductor light-emitting devices which comprises:

a. providing a semiconductor body having a region of N-type conductivity;
b. applying to said body a diffusion barrier comprising a first layer of silica, a second layer of phosphorus doped silica and a third layer of silica;
c. exposing a selected area of said body to the ambient atmosphere by opening windows thereto through said diffusion barrier;
d. diffusing said body with a P-type impurity to form a region of P-type conductivity in said body;
e. removing said diffusion barrier from said body and a portion of the top surface of said body;
f. applying a coating of silica to said body;
g. opening a window in said coating of silica to expose a selected region of said region of P-type conductivity;
h. applying a metallization coating to the surface of said body to provide ohmic contact to said P-region;
i. etching the desired contact pattern in said metallization coating;
j. applying an ohmic contact to an N-type region of said body by applying successive layers of tin, gold, nickel and gold and alloying said layers to said body;
k. attaching said semiconductor body to a base by bonding means providing good mechanical support and electrical connection and;
l. providing means for connecting said semiconductor to an outside circuit.

2. Process according to claim 1 wherein said semiconductor body is $GaAs_{1-x}P_x$, wherein $x$ is a number from zero to one inclusive; said P-type impurity is zinc; said metallization coating is aluminum; said bonding means is gold/epoxy and said base is gold-plated Kovar.

3. Process according to claim 1 wherein said semiconductor body is GaAs.

4. Process according to claim 1 wherein said semiconductor body is GaP.

* * * * *